United States Patent
Kumegawa et al.

(10) Patent No.: US 9,691,610 B2
(45) Date of Patent: Jun. 27, 2017

(54) METHOD FOR PRODUCING A GROUP III NITRIDE SEMICONDUCTOR CRYSTAL AND METHOD FOR PRODUCING A GAN SUBSTRATE

(71) Applicant: TOYODA GOSEI CO., LTD., Kiyosu-shi (JP)

(72) Inventors: Shohei Kumegawa, Kiyosu (JP); Yasuhide Yakushi, Kiyosu (JP); Seiji Nagai, Kiyosu (JP); Miki Moriyama, Kiyosu (JP)

(73) Assignee: TOYODA GOSEI CO., LTD, Kiyosu-Shi, Aichi-Ken (JP)

( * ) Notice: Subject to any disclaimer, the term of this patent is extended or adjusted under 35 U.S.C. 154(b) by 383 days.

(21) Appl. No.: 14/295,204

(22) Filed: Jun. 3, 2014

(65) Prior Publication Data
US 2014/0360426 A1 Dec. 11, 2014

(30) Foreign Application Priority Data
Jun. 7, 2013 (JP) .................. 2013-121241

(51) Int. Cl.
*C30B 9/10* (2006.01)
*H01L 21/02* (2006.01)
*H01L 21/78* (2006.01)

(52) U.S. Cl.
CPC .... *H01L 21/0254* (2013.01); *H01L 21/02623* (2013.01); *H01L 21/02642* (2013.01); *H01L 21/02647* (2013.01); *H01L 21/7806* (2013.01)

(58) Field of Classification Search
CPC ......... C30B 29/406; C30B 29/38; C30B 9/10; C30B 9/12
See application file for complete search history.

(56) References Cited

U.S. PATENT DOCUMENTS 6,979,584 B2 12/2005 Koike et al.
7,176,115 B2 2/2007 Kitaoka et al.
(Continued)

FOREIGN PATENT DOCUMENTS

CN 1413357 A 4/2003
CN 1429401 A 7/2003
(Continued)

OTHER PUBLICATIONS

United States Office Action dated Mar. 22, 2016, in U.S. Appl. No. 13/762,318.
(Continued)

*Primary Examiner* — Robert M Kunemund
(74) *Attorney, Agent, or Firm* — McGinn IP Law Group, PLLC

(57) ABSTRACT

The present invention provides a method for producing a Group III nitride semiconductor crystal and a GaN substrate, in which the transfer of dislocation density or the occurrence of cracks can be certainly reduced on a growth substrate, and the Group III nitride semiconductor crystal can be easily separated from a seed crystal. A mask layer is formed on a GaN substrate, to thereby form an exposed portion of the GaN substrate, and an unexposed portion of the GaN substrate. Through a flux method, a GaN layer is formed on the exposed portions of the GaN substrate in a molten mixture containing at least Group III metal and Na. At that time, non-crystal portions containing the components of the molten mixture are formed on the mask layer so as to be covered with the GaN layer grown on the GaN substrate and the mask layer.

17 Claims, 9 Drawing Sheets

(56) References Cited

U.S. PATENT DOCUMENTS

| | | |
|---|---|---|
| 7,560,725 B2 | 7/2009 | Koike et al. |
| 8,928,004 B2 | 1/2015 | Choe et al. |
| 9,117,674 B2 | 8/2015 | Eymery et al. |
| 2002/0117104 A1 | 8/2002 | Hata et al. |
| 2003/0092263 A1 | 5/2003 | Koike et al. |
| 2004/0089919 A1 | 5/2004 | Motoki et al. |
| 2004/0147096 A1 | 7/2004 | Kitaoka et al. |
| 2004/0183090 A1 | 9/2004 | Kitaoka et al. |
| 2005/0059229 A1 | 3/2005 | Minemoto et al. |
| 2005/0082564 A1* | 4/2005 | Kitaoka .............. H01L 21/0237 257/103 |
| 2006/0027831 A1 | 2/2006 | Kioke et al. |
| 2007/0084399 A1 | 4/2007 | Sarayama et al. |
| 2011/0024796 A1 | 2/2011 | Miyoshi et al. |
| 2011/0110840 A1 | 5/2011 | Miyanaga et al. |
| 2011/0155046 A1* | 6/2011 | Yamazaki ................. C30B 9/10 117/56 |
| 2012/0085279 A1 | 4/2012 | Sarayama et al. |
| 2012/0164058 A1* | 6/2012 | Uemura ................ C30B 25/186 423/409 |
| 2013/0199438 A1 | 8/2013 | Nagai et al. |
| 2014/0077223 A1 | 3/2014 | Choe et al. |
| 2014/0080290 A1 | 3/2014 | Eymery et al. |
| 2014/0124816 A1 | 5/2014 | Choe et al. |

FOREIGN PATENT DOCUMENTS

| | | |
|---|---|---|
| CN | 1641835 A | 7/2005 |
| CN | 1664179 A | 9/2005 |
| CN | 1954101 A | 4/2007 |
| CN | 101393958 A | 3/2009 |
| CN | 101432471 A | 5/2009 |
| CN | 101558187 A | 10/2009 |
| CN | 101925696 A | 12/2010 |
| EP | 1576210 B1 | 2/2010 |
| JP | H10-312971 A | 11/1998 |
| JP | 2005-12171 A | 1/2005 |
| JP | 2005-012171 A | 1/2005 |
| JP | 2005-225681 A | 8/2005 |
| JP | 2006-131454 A | 5/2006 |
| JP | 2006-169024 A | 6/2006 |
| JP | 2008-150239 A | 7/2008 |
| JP | 2010-037153 A | 2/2010 |
| JP | 2010-171273 A | 8/2010 |
| JP | 2011-132110 A | 7/2011 |
| JP | 2012-197194 A | 10/2012 |
| WO | WO 03/072856 A1 | 9/2003 |
| WO | WO 2012/136665 A1 | 10/2012 |
| WO | WO 2013/021606 A1 | 2/2013 |

OTHER PUBLICATIONS

United States Notice of Allowance dated May 22, 2015 in co-pending U.S. Appl. No. 14/300,927.

Specification, claims and Drawings for U.S. Appl. No. 14/300,927.

Japanese Office Action for Japanese Patent Application No. 2012-062530 dated Jun. 3, 2014 with a partial English translation thereof.

Japanese Office Action for Japanese Patent Application No. 2012-062268 dated Jun. 3, 2014 with a partial English translation thereof.

Japanese Office Action dated Aug. 6, 2014 with a partial English translation.

U.S. Office Action dated Oct. 21, 2015 in the co-pending U.S. Appl. No. 13/762,318.

Chinese Office Action dated Feb. 11, 2015 with an English translation thereof.

United States Office Action dated Aug. 19, 2014 in U.S. Appl. No. 12/926,995.

U.S. Office Action dated Aug. 12, 2015 in the co-pending U.S. Appl. No. 13/762,318.

Chinese Office Action dated Apr. 21, 2016 with an English translation thereof.

Japanese Office Action dated May 10, 2016 with an English translation thereof.

Chinese Office Action dated Sep. 21, 2016 with an English translation.

* cited by examiner

METHOD FOR PRODUCING A GROUP III NITRIDE SEMICONDUCTOR CRYSTAL AND METHOD FOR PRODUCING A GAN SUBSTRATE

BACKGROUND OF THE INVENTION

Field of the Invention

The present invention relates to a method for producing a Group III nitride semiconductor crystal and to a method for producing a GaN substrate. More particularly, the invention relates to a method for producing a Group III nitride semiconductor crystal and to a method for producing a GaN substrate, which methods employ a flux method.

Background Art

A variety of methods for producing a semiconductor crystal are known, and examples thereof include vapor phase growth methods such as metalorganic chemical vapor deposition (MOCVD) and hydride vapor phase epitaxy (HVPE), molecular beam epitaxy (MBE), and liquid phase epitaxy (LPE). One technique of LPE is a flux method employing a Na flux.

In the flux method, a molten mixture of metallic Na (sodium) and metallic Ga (gallium) is reacted with nitrogen under pressure for the growth of a GaN crystal. This method is expected to produce an inexpensive and high-quality GaN substrate because GaN crystal can be grown at a comparatively low temperature (up to 1,000° C.) and low pressure (up to 10 MPa).

In the case where a GaN crystal is grown on an underlayer (GaN or AlN) serving as a seed crystal through a flux method, the crystal properties of the GaN crystal are inherited from those of the underlayer. That is, the dislocation density of the semiconductor crystal to be grown is inherited from that of the underlayer. Therefore, the dislocation density of the grown semiconductor crystal is about $5\times10^6/cm^2$ to $1\times10^7/cm^2$ as same order as that of the underlayer.

A smaller dislocation density for the grown semiconductor crystal is preferred. For example, a dislocation density of $1\times10^5/cm^2$ or less is preferred. Thus, in order to produce a GaN crystal having a smaller dislocation density, the dislocation density must be considerably reduced during the growth of a GaN crystal. Japanese Patent Application Laid-Open (kokai) No. 2005-12171 discloses an example of such method that a mask layer is formed on a seed crystal and GaN is laterally grown over the mask.

However, in the method disclosed in Japanese Patent Application Laid-Open (kokai) No. 2005-12171, dislocations propagating on the mask layer can be reduced, but the stress from the mask layer is applied to the semiconductor crystal, resulting in two problems: (1) new dislocations occur at the joint interface of growing crystals, and (2) cracks occur.

When a semiconductor crystal is grown on a larger diameter wafer, more preferably, the semiconductor crystal can be easily separated from the growth substrate. It is because the separated crystal is suitable for a GaN substrate in the case where a GaN crystal with a low dislocation density is formed as a semiconductor crystal. Therefore, a semiconductor crystal is preferably formed so as to be easily separated from the growth substrate.

SUMMARY OF THE INVENTION

The present invention has been conceived in order to overcome the aforementioned drawbacks involved in conventional techniques. Thus, an object of the present invention is to provide a method for producing a Group III nitride semiconductor crystal and a method for producing a GaN substrate, where the propagation of dislocations and the occurrence of cracks can be certainly reduced on the growth substrate, and the Group III nitride semiconductor crystal can be easily separated from the seed crystal.

In a first aspect of the present invention, there is provided a method for producing a Group III nitride semiconductor crystal, the method comprising:

a mask layer formation step of forming a mask layer on an underlayer, to thereby form an exposed portion of the underlayer which is not covered with the mask layer, and an unexposed portion of the underlayer which is covered with the mask layer;

a semiconductor crystal formation step of growing a Group III nitride semiconductor crystal on the exposed portion of the underlayer in a molten mixture containing at least Group III metal and Na; and wherein, in the semiconductor crystal formation step, the Group III nitride semiconductor crystal is grown on the exposed portion of the underlayer, and non-crystal portions containing the components of the molten mixture are formed on the mask layer.

In the above method for producing a Group III nitride semiconductor crystal, a semiconductor crystal grows not on the unexposed portion which is covered with the mask layer, but on the exposed portion which is not covered with the mask layer semiconductor crystal. Here, "the mask layer" is a layer to inhibit the growth of the semiconductor crystal. Therefore, only dislocations on the exposed portion of the underlayer are inherited to the growing semiconductor crystal. Thus, some of the dislocations are not inherited from the underlayer, and a semiconductor crystal with a low dislocation density can be grown. The non-crystal portions are not connected with the grown semiconductor crystal or the underlayer because the non-crystal portions are liquid at the growth temperature. Therefore, a semiconductor crystal grows with the stress from the mask hardly applied, thereby minimizing the occurrence of the dislocations at the merged interface.

A second aspect of the present invention is a specific embodiment of the method for producing a Group III nitride semiconductor crystal of the first aspect, wherein the exposed portion comprises a plurality of growth starting regions discretely disposed and connecting portions to connect the growth starting regions. At this time, the dislocations at the connecting portions are not inherited to the growing semiconductor layer. Even if a distance between the growth starting regions is large, uniform lateral growth can be achieved, that is, dislocations can be effectively reduced.

A third aspect of the present invention is a specific embodiment of the method for producing a Group III nitride semiconductor crystal of the second aspect, wherein the growth starting regions are disposed at vertices of a triangle, and the connecting portions are disposed at positions corresponding to sides of a triangle.

A fourth aspect of the present invention is a specific embodiment of the method for producing a Group III nitride semiconductor crystal of the third aspect, wherein the connecting portions are formed with a longitudinal direction thereof oriented in a direction of 5° or less from the m-axis of the underlayer.

A fifth aspect of the present invention is a specific embodiment of the method for producing a Group III nitride semiconductor crystal of any of the first to fourth aspects, the method further comprises:

a first mask layer formation step of forming a first mask layer on an underlayer;

a first semiconductor crystal formation step of forming a first Group III nitride semiconductor crystal on the first mask layer in a molten mixture;

a second mask layer formation step of forming a second mask layer on the first Group III nitride semiconductor crystal; and a second semiconductor crystal formation step of forming a second Group III nitride semiconductor crystal on the second mask layer in a molten mixture.

A sixth aspect of the present invention is a specific embodiment of the method for producing a Group III nitride semiconductor crystal of the fifth aspect, wherein the second mask layer is formed at a position perpendicular to the main surface of the mask layer as viewed from the exposed portion of the first mask layer.

A seventh aspect of the present invention is a specific embodiment of the method for producing a Group III nitride semiconductor crystal of any of the first to sixth aspects, wherein the mask layer is formed through atomic layer deposition.

An eighth aspect of the present invention is a specific embodiment of the method for producing a Group III nitride semiconductor crystal of any of the first to seventh aspects, wherein, in the mask layer formation step, the mask layer comprises $Al_2O_3$.

A ninth aspect of the present invention is a specific embodiment of the method for producing a Group III nitride semiconductor crystal of any of the first to seventh aspects, wherein, the mask layer comprises at least one of $ZrO_2$ and $TiO_2$.

In a tenth aspect of the present invention, there is provided a method for producing a Group III nitride semiconductor substrate, the method comprises:

a mask layer formation step of forming a mask layer on an underlayer, to thereby form an exposed portion of the underlayer which is not covered with the mask layer, and an unexposed portion of the underlayer which is covered with the mask layer;

a semiconductor crystal formation step of growing a Group III nitride semiconductor crystal on the exposed portion of the underlayer in a molten mixture containing at least Ga and Na; and a semiconductor crystal separation step of separating the Group III nitride semiconductor crystal from the seed crystal. In the semiconductor crystal formation step, the Group III nitride semiconductor crystal is grown on the exposed portion of the underlayer, and a non-crystal portion containing the components of the molten mixture is formed on the mask layer.

On the thus produced Group III nitride semiconductor substrate, the transfer of dislocations is blocked by the mask, and dislocations hardly occur even at the joint interface. That is, the dislocations of the Group III nitride semiconductor substrate are sufficiently smaller than those of the conventional substrate. The area of the seed crystal that is in contact with the Group III nitride semiconductor crystal is sufficiently small. Therefore, the Group III nitride semiconductor crystal can be easily separated from the seed crystal.

An eleventh aspect of the present invention is a specific embodiment of the method for producing a Group III nitride semiconductor substrate of the tenth aspect, wherein the exposed portion comprises a plurality of growth starting regions discretely disposed and connecting portions to connect the growth starting regions.

A twelfth aspect of the present invention is a specific embodiment of the method for producing a Group III nitride semiconductor substrate of the eleventh aspect, wherein the growth starting regions are disposed at vertices of a triangle, and the connecting portions are disposed at positions corresponding to sides of a triangle.

A thirteenth aspect of the present invention is a specific embodiment of the method for producing a Group III nitride semiconductor substrate of the twelfth aspect, wherein the connecting portions are formed with a longitudinal direction thereof oriented at an angle of 5° or less from the m-axis of the underlayer.

A fourteenth aspect of the present invention is a specific embodiment of the method for producing a Group III nitride semiconductor substrate of any of the tenth to thirteenth aspects, wherein, in the semiconductor crystal separation step, when separating the Group III nitride semiconductor crystal from the seed crystal, the components of the molten mixture are removed out from the non-crystal portions. The Group III nitride semiconductor substrate described above may be a GaN substrate.

The present invention enables provision of a method for producing a Group III nitride semiconductor crystal exhibiting no residual stresses or cracks and having a remarkably reduced dislocation density, and a method for producing a Group III nitride semiconductor substrate, e.g., GaN substrate, exhibiting no residual stresses or cracks and having a remarkably reduced dislocation density.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
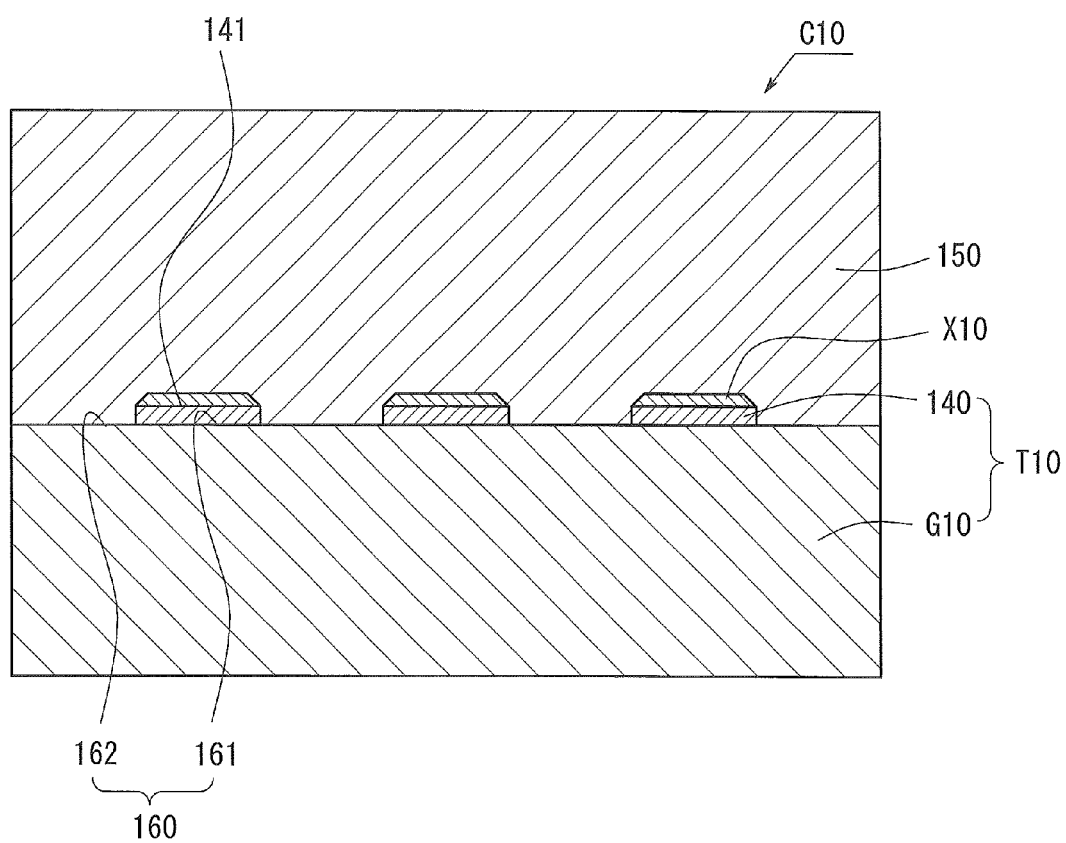
FIG. 1 is a sketch (part 1) for describing a Group III nitride semiconductor crystal according to Embodiment 1.

Hereinafter, specific embodiments of the present invention will be described with reference to the drawings. However, these embodiments are given only for the purpose of illustration and should not be construed as limiting the invention thereto. In the drawings, the thickness of each layer is not an actually measured one but a conceptual thickness.

In Embodiments 1 to 3, a method for producing a Group III nitride semiconductor crystal will be described. In Embodiment 4, a method for producing a GaN substrate using the method for producing a Group III nitride semiconductor crystal described in Embodiments 1 to 3 will be described.

Embodiment 1

Embodiment 1 will be described. In Embodiment 1, a Group III nitride semiconductor crystal is grown on a GaN self-standing substrate.

1. Group III Nitride Semiconductor Crystal 1-1. GaN Crystal

FIG. 1 shows the structure of GaN crystal C10 produced through the method for producing a Group III nitride semiconductor crystal according to Embodiment 1. The GaN crystal C10 of Embodiment 1 is produced through a flux method. The GaN crystal C10 has a seed crystal T10 and a GaN layer 150. The seed crystal T10 has a GaN substrate G10 and a patterned mask layer 140. Non-crystal portions X10, i.e., inclusions, molten mixture, gasses of nitrogen, etc., space, etc., are formed between the mask layer 140 of the seed crystal T10 and the GaN layer 150.

The mask layer 140 is formed on the GaN substrate G10 as an underlayer, more specifically, on a portion 161 of a main surface 160 of the GaN substrate G10. The mask layer 140 is a flux resistant layer. The mask layer 140 is formed of, for example, $Al_2O_3$. Therefore, semiconductor crystal does not vertically grow on the mask layer 140. That is, the mask layer 140 is a layer to inhibit the growth of the GaN layer 150.

The non-crystal portions X10 are portions in which no semiconductor crystal has been formed. Each non-crystal portion X10 is filled with flux. Each non-crystal portion X10 is defined by a surface (main surface) 141 of the mask layer 140 and the GaN layer 150. At the growth temperature, non-crystal portions X10 are liquid. Therefore, the non-crystal portions X10 are not connected with the mask layer 140 and the GaN layer 150.

The GaN layer 150 is a GaN single crystal. The GaN layer 150 is formed on the remaining portion 162, i.e., exposed portion, of the main surface 160 of the GaN substrate G10 and on the non-crystal portions X10. The bottom surface of the GaN layer 150 is almost flat. As described in the Examples hereinbelow, the thickness of the GaN layer 150 may be adjusted to about 1 mm.

1-2. Dislocation Density of Crystal

The GaN crystal C10 of Embodiment 1 has non-crystal portions X10. The GaN layer 150 is a semiconductor layer grown on and from the remaining portion 162 of the main surface 160 of the GaN substrate G10 because GaN does not grow from the non-crystal portions X10. That is, a GaN crystal which grows from the remaining portion 162 of the main surface 160 of the GaN substrate G10 as a growth starting point also laterally grows over the mask layer 140, and joins with the adjacent crystal around the center of the mask layer 140. Accordingly, for the portions of the GaN layer 150 formed on the non-crystal portions X10, threading dislocations are not inherited from the GaN substrate G10 because the dislocations are bent to a direction parallel to the main surface 160. The dislocations do not newly occur as described in the Examples hereinbelow at the joint interface. Thus, the GaN layer 150 has excellent crystallinity, specifically, the GaN layer 150 on the non-crystal portion X10 has a dislocation density of $1 \times 10^5/cm^2$ or less. To obtain a GaN crystal with a low dislocation density, the area of the mask layer 140 is, preferably, as large as possible. When the area of the mask layer 140 is too small, GaN is difficult to grow.

1-3. Separability of Crystal

Figure 2:
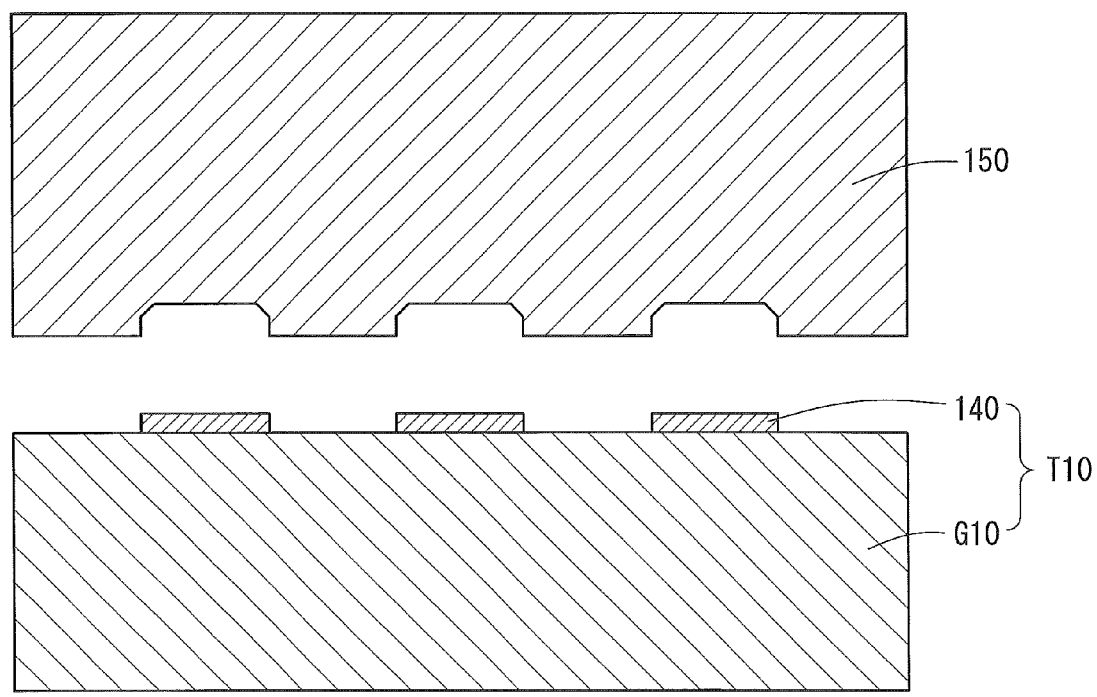
FIG. 2 is a sketch (part 2) for describing the Group III nitride semiconductor crystal according to Embodiment 1.

In the GaN crystal C10 of Embodiment 1, the GaN layer 150 can be readily separated from the seed crystal T10 since the stress attributed to warpage of the seed crystal T10 or the stress from the mask layer 140 is applied mainly to the interface between the seed crystal T10 and the GaN layer 150. In some cases, the GaN layer 150 is spontaneously removed from the seed crystal T10 at the time of temperature lowering performed after crystal growth. Alternatively, by applying slight impact to the stacked body after crystal growth, the GaN layer 150 may be removed from the seed crystal T10. FIG. 2 shows the GaN layer 150 and the seed crystal T10 after separation. Thus, the GaN layer 150 is readily removed from the GaN substrate G10, by virtue of non-crystal portions X10 containing the molten mixture components.

As described above, non-crystal portions X10 are intentionally provided in order to intercept inheritance of threading dislocations, thereby a Group III nitride semiconductor crystal which has excellent crystallinity and which can be readily separated from the seed crystal T10 can be produced.

2. Seed Crystal 2-1. Seed Crystal

Figure 3:
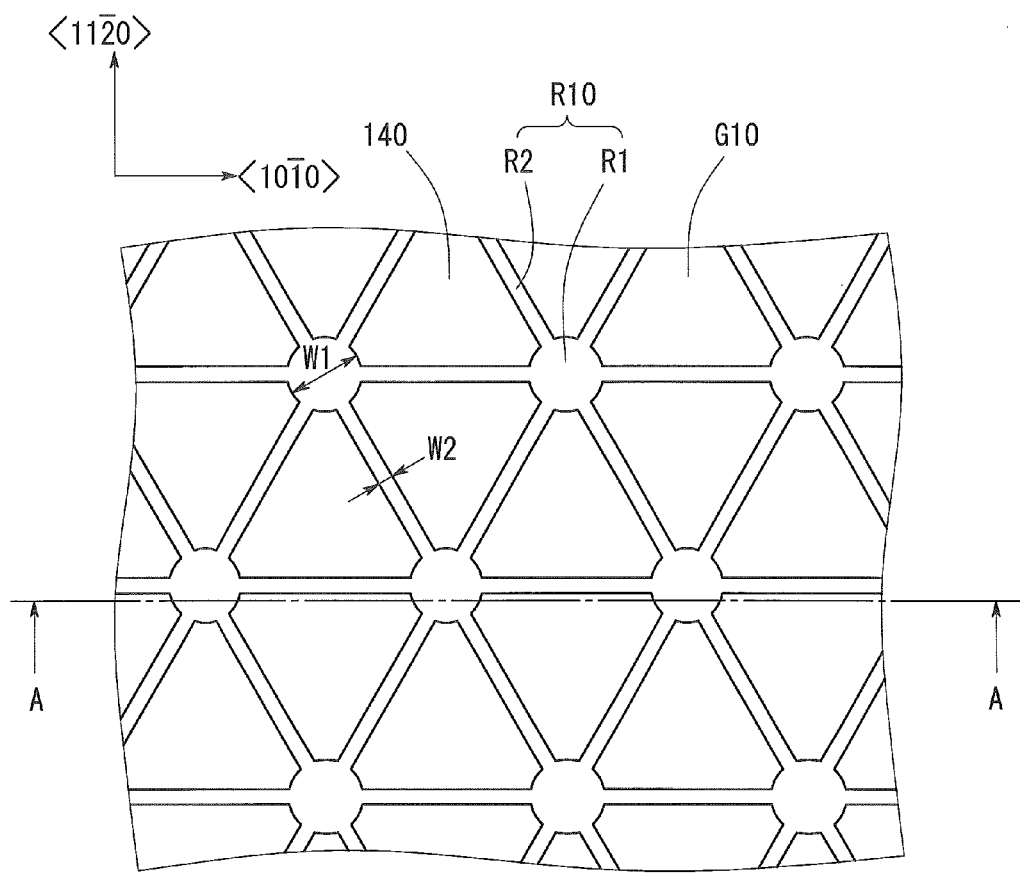
FIG. 3 is a plan view for describing a seed crystal used in a method for producing a Group III nitride semiconductor crystal according to Embodiment 1.
Figure 4:
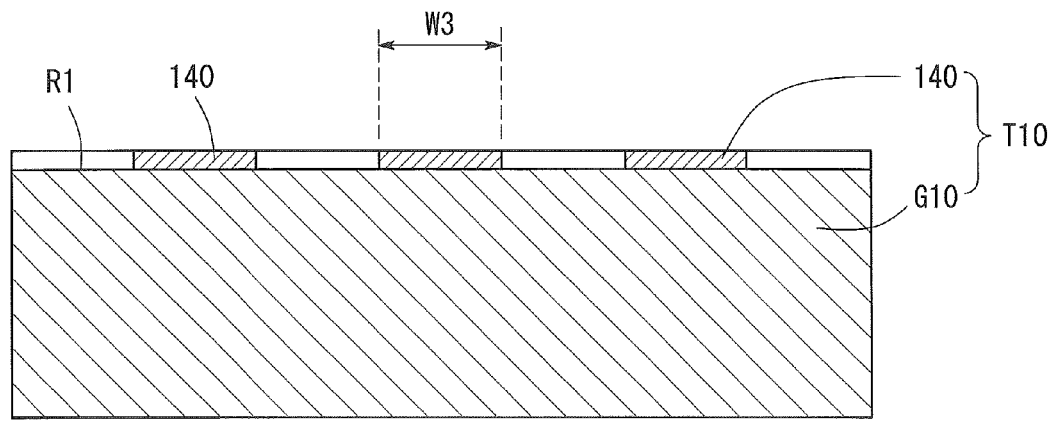
FIG. 4 is an A-A cross section view of FIG. 3.

In Embodiment 1, the GaN layer 150 shown in FIG. 1 is grown through a flux method. Then, the seed crystal T10 used in the flux method will be described. The seed crystal T10 is shown in FIGS. 3 and 4. FIG. 3 is a plan view of the seed crystal T10 as viewed from the top. FIG. 4 is an A-A cross section view of FIG. 3.

2-2. Shape of Seed Crystal

As shown in FIG. 3, the seed crystal T10 comprises the GaN substrate G10 and the mask layer 140. The mask layer 140 has a pattern in which shapes close to a triangle are periodically disposed. The exposed portion R10 of the GaN substrate G10 which is not covered with the mask layer 140 comprises first regions R1 and second regions R2. The first regions R1 are provided on the main surface 160 of the GaN substrate G10. The main surface 160 is a c-plane of GaN. Each first region R1 has a shape close to a circle. The first regions R1 serve as starting points of GaN crystal growth, i.e., growth starting regions.

The second regions R2 are provided in a linear pattern on the main surface 160 of the GaN substrate G10. Three neighboring first regions R1 constitute a triangle. This triangle is close to a regular triangle. The second regions R2 are connecting portions to connect the neighboring first regions R1, i.e., growth starting regions. The second regions R2 serve as guides to guide the laterally spreading of GaN crystal that started to grow from the first regions R1 as growth starting points. In other words, it is to promote the lateral growth of GaN layer over the mask layer 140. The second regions R2 are provided at positions corresponding to sides of the triangle defined by the neighboring first regions R1. The first regions R1 are provided at vertices of the triangle. Thus, any one section of the mask layer 140 is disposed, partitioned by the first regions R1 and the second regions R2.

Each first region R1 has an inside width W1 of 1 μm to 2,000 μm. When the inside width W1 is less than 1 GaN crystal does not grow or cannot uniformly grow. On the other hand, when the inside width W1 is in excess of 2,000 μm, the effect of reducing dislocations is insufficient. The inside width W1 is preferably 10 μm to 500 μm.

Each second region R2 has a width W2 of 200 μm or less. The width W2 is sufficiently smaller than the inside width W1, specifically, satisfies the following relation:

$$W1 > 2 \times W2$$

The present inventors have found that when there are two different types of regions on the seed crystal, i.e., the first region R1 and the second region R2, in the flux method, crystal is selectively grown on the seed crystal with a larger area thereof. Therefore, a semiconductor crystal can be grown only on the region having the inside width W1 of two types of regions having the inside width W1 and the width W2, without generating dislocations in the second region R2, and the second region R2 serves as a guide of the lateral growth.

The ratio of the area of the mask layer 140 to the whole area of the main surface 160 of the GaN substrate G10 is preferably 50% or more. In Embodiment 1, even if the area ratio of the mask layer 140 is increased, a semiconductor crystal can be stably grown because the second regions R2 are formed to promote the lateral growth of GaN layer.

3. Atomic Layer Deposition (ALD)

In Embodiment 1, a mask layer 140 is formed through atomic layer deposition (ALD). ALD is superior in reproducibility for film quality and film thickness. The mask layer 140 is formed of, for example, $Al_2O_3$. The mask layer 140 has a thickness of 10 nm to 500 nm. The mask layer 140 has a side length of 20 μm to 5,000 μm. An $Al_2O_3$ film formed through ALD is dense. Therefore, the $Al_2O_3$ film is hardly dissolved in the flux.

The mask layer 140 may be formed of a material other than $Al_2O_3$, such as $TiO_2$ or $ZrO_2$. When the mask layer 140 is formed of $SiO_2$ or $SiN_4$ containing Si, Si atoms are dissolved in the flux, thereby inhibiting the growth.

4. Semiconductor Crystal Production Apparatus

Figure 5:
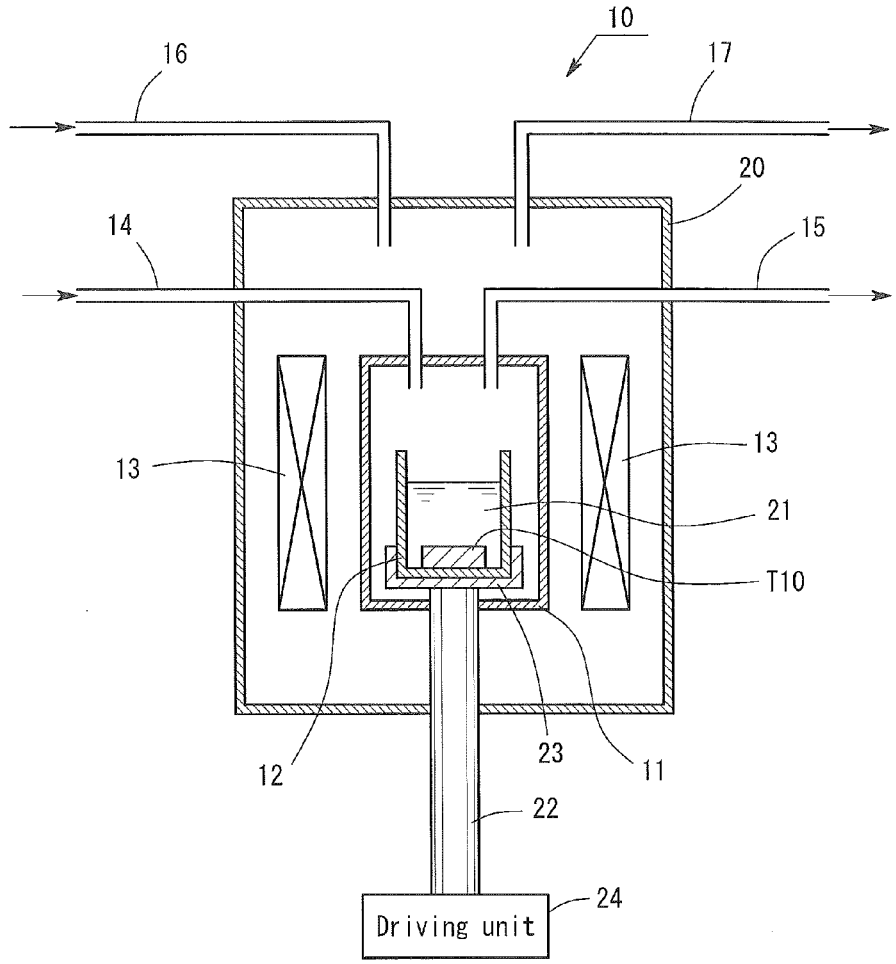
FIG. 5 shows the structure of a semiconductor crystal production apparatus used in a method for producing a Group III nitride semiconductor crystal according to Embodiments.

The semiconductor crystal production apparatus of Embodiment 1 will next be described. The semiconductor crystal production apparatus 10 shown in FIG. 5 is an apparatus for growing a Group III nitride semiconductor through a flux method. As shown in FIG. 5, the semiconductor crystal production apparatus 10 includes a pressure container 20, a reaction vessel 11, a crucible 12, a heating apparatus 13, supply pipes 14, 16, and discharge pipes 15, 17.

The pressure container 20 is a pressure-resistant hollow cylinder made of stainless steel. To the pressure container 20, the supply pipe 16 and the discharge pipe 17 are connected. In the pressure container 20, the reaction vessel 11 and the heating apparatus 13 are disposed. Through placing the reaction vessel 11 in the pressure container 20, the reaction vessel 11 does not require particularly high pressure resistance. Thus, the reaction vessel 11 may be made of an inexpensive material, and recyclability is improved.

The reaction vessel 11 is made of SUS and has heat resistance. In the reaction vessel 11, the crucible 12 is placed. The crucible 12 is made of a material such as W (tungsten), Mo (molybdenum), BN (boron nitride), alumina, or YAG (yttrium aluminum garnet). The crucible 12 holds a molten mixture 21 containing Ga and Na, and a seed crystal T10 is maintained in the molten mixture 21.

To the reaction vessel 11, the supply pipe 14 and the discharge pipe 15 are connected. Through operation of valves (not illustrated) attached to the supply pipe 14 and the discharge pipe 15, there are performed aeration in and feeding nitrogen into the reaction vessel 11, and controlling the pressure inside the reaction vessel 11. Nitrogen is also supplied to the pressure container 20 via the supply pipe 16. Through operation of valves (not illustrated) attached to the supply pipe 16 and the discharge pipe 17, the nitrogen flow rate and discharge rate are controlled, thereby the pressure inside the pressure container 20 is virtually equalized with that of the reaction vessel 11. The temperature inside the reaction vessel 11 is controlled by means of the heating apparatus 13.

The semiconductor crystal production apparatus 10 is provided with an apparatus which can rotate the crucible 12 so as to stir the molten mixture 21 contained in the crucible 12, thereby the molten mixture 21 is stirred during the growth of a GaN crystal. By virtue of the apparatus, the molten mixture 21 can have a uniform Na, Ga, or N concentration distribution profile, thereby a GaN crystal of uniform quality can be grown. The apparatus which can rotate the crucible 12 has a rotation axis 22, a turn-table 23, and a driving unit 24. The rotation axis 22 extends from the inside of the reaction vessel 11 to the outside of the pressure container 20. The turn-table 23 is disposed in the reaction vessel 11 and is connected to the rotation axis 22 so that it sustains the crucible 12. The driving unit 24 controls rotation of the rotation axis 22. The turn-table 23 is rotated through rotation of the rotation axis 22 driven by the driving unit 24, thereby the crucible 12 sustained by the turn-table 23 is rotated.

Meanwhile, when the employed reaction vessel 11 has pressure resistance, the pressure container 20 is not necessarily employed. In addition, in order to prevent vaporization of Na during growth of a GaN crystal, the crucible 12 may be provided with a lid. Instead of or in addition to the crucible 12 rotating means, crucible 12 swinging means may be provided.

5. Method for Producing a Group III Nitride Semiconductor Crystal

The method for producing a Group III nitride semiconductor crystal according to Embodiment 1 includes the following steps:

(A) Mask layer formation step
(B) Semiconductor crystal formation step

These steps will next be described in detail.

5-1. (A) Mask Layer Formation Step

Firstly, a GaN substrate G10 is provided. The GaN substrate G10 is a self-standing GaN substrate and has a dislocation density of about $5 \times 10^6/cm^2$. The GaN substrate G10 also serves as an underlayer on which a mask layer is to be formed. Thus, a mask layer 140 is formed on the GaN substrate G10 through ALD. At that time, an exposed portion R10 in which the GaN substrate G10 is exposed and an unexposed portion in which the GaN substrate G10 is not exposed are formed. Eventually, a seed crystal T10 shown in FIG. 4 is produced.

5-2. (B) Semiconductor Crystal Formation Step

A semiconductor crystal is formed on the seed crystal T10 through a flux method, which is a technique of liquid phase epitaxy. That is, as shown in FIG. 5, the seed crystal T10 and the raw materials are placed in the semiconductor crystal production apparatus 10. Table 1 shows the raw materials (flux) employed herein. The Ga ratio is preferably 5 mol % to 40 mol %. The carbon ratio may be varied from 0 mol % to 2.0 mol % based on Na. That is, the flux may or may not contain carbon, and preferably has a carbon content of 0.01 mol % to 2.0 mol %. Notably, the amounts of the elements shown in Table 1 are merely examples, and other amounts may be employed.

Needless to say, the target semiconductor crystal is a Group III nitride semiconductor crystal, which may be GaN, AlGaN, InGaN, AlInGaN, etc. Firstly, the raw materials shown in Table 1 are weighed in a glovebox in which dew point and oxygen level are controlled. Notably, the amounts of the raw materials shown in Table 1 are merely examples, and other amounts may be employed. Then, the seed crystal T10 and the raw materials are placed in the crucible 12 made of alumina. Next, the crucible 12 is placed on a turn-table 23 disposed in the reaction vessel 11 in the semiconductor crystal production apparatus 10. The pressure container 20 is evacuated, and the pressure and temperature inside the container 20 are elevated thereafter. At this time, nitrogen gas which is one of the raw materials is supplied inside the reaction vessel 11.

TABLE 1

| Ga | 20 g to 80 g |
| Na | 20 g to 80 g |
| C | 0.01 mol % to 2.0 mol % (based on Na) |

Table 2 shows the conditions employed in the above step and in the crucible 12. Actually, the temperature is 870° C., and the pressure is 4 MPa. Under these conditions, the aforementioned materials are melted to form a molten mixture. The mixture is stirred at 20 rpm. The direction of the rotation of the turn-table 23 is appropriately altered in a predetermined period. The exposed surface 162 of the seed crystal T10 may undergo melting back.

TABLE 2

| Temperature | 850° C. to 1,000° C. |
| Pressure | 3 MPa to 10 MPa |
| Stirring condition | 0 rpm to 100 rpm |
| Growth time | 20 to 200 hours |

Figure 6:
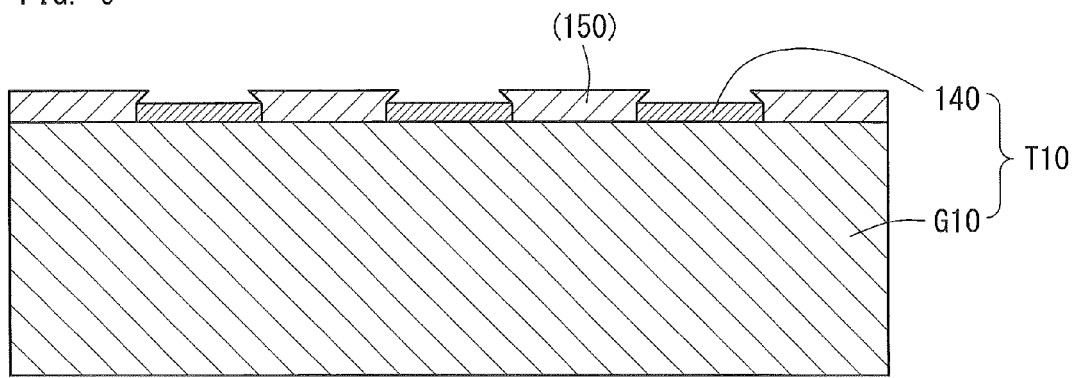
FIG. 6 is a sketch for describing the method for producing a Group III nitride semiconductor crystal according to Embodiment 1.

After the raw material concentrations of flux reached super-saturation through pressurization, a GaN layer 150 starts to grow on the seed crystal T10 shown in FIG. 4 in the molten mixture. The GaN layer 150 is a semiconductor single crystal. In this case, the GaN layer 150 is grown in the upward (vertical) direction from the surface of the first region R1 as a growth starting point and grown in the lateral direction over the mask layer 140. The upward (vertical) direction is a c-axis of growing GaN, that is, GaN grows along the c-axis on the c-plane of GaN. As shown in FIG. 6, the GaN layer 150 is grown so as to fill in the first regions R1 and grown further in the lateral direction and the upward direction. At the second regions R2, the GaN layer 150 is grown in the lateral direction along the second region R2.

At the portions having no first region R1 and second region R2, i.e., on the mask layer 140, as shown in FIG. 6, a part of the GaN layer 150 grown diagonally from the growth starting point (first region R1) is merged and joined with an another part of the GaN layer 150 grown diagonally from other growth starting point. In this way, non-crystal portions X10 are formed so as to be covered with the GaN layers 150 grown on the first regions R1 and over the mask layer 140. The joined and flat GaN layers 150 are grown in the upward direction, and the GaN crystal C10 shown in FIG. 1 is produced. The growth time is 20 to 200 hours as shown in Table 2. The thickness of the non-crystal portion X10 can be controlled by adjusting the lateral growth rate and the vertical growth rate of GaN. To form stable non-crystal portions X10, the growth temperature, pressure, and carbon content are adjusted so that the lateral growth rate is 1.3 times or more than the vertical growth rate.

6. Variation 6-1. Group III Nitride Semiconductor Crystal

In Embodiment 1, a GaN layer 150 is formed. However, the method of the invention may be applied to production of other Group III nitride semiconductor crystals. That is, the production method of the invention is applicable to production of crystal $Al_XIn_YGa_{(1-X-Y)}N$ ($0 \leq X$, $0 \leq Y$, $X+Y \leq 1$). In this case, semiconductor crystal may be grown in the molten mixture containing at least Group III metal and Na.

6-2. Structure of Underlayer

In Embodiment 1, the GaN substrate G10 of an ingot serves as an underlayer. However, a GaN layer may be further epitaxially grown on the GaN substrate. In that case, the epitaxial GaN layer formed on the ingot GaN substrate may be considered as an underlayer. Two layers consisting of the GaN substrate and the epitaxial GaN layer formed thereon may be considered as an underlayer.

6-3. Second Region

The linear second regions R2 on the c-plane of GaN may be provided parallel to the m-axis or the a-plane of the GaN substrate G10, i.e., perpendicular to the a-axis of the GaN substrate G10. Therefore, a direction from three vertices of each triangle of the mask layer 140 toward the center of each triangle is the a-axis. A growth rate of the a-axis direction is larger than that of the m-axis. Therefore, GaN grown on the first region R1 is a regular hexagonal crystal having the a-axis parallel to the a-axis of the GaN substrate G10. As a result, the center of each triangle of the mask layer 140 serves as the vertices of the regular hexagon of GaN laterally grown, and GaN smoothly joined to each other at the center of the triangle. Accordingly, the effect of promoting the lateral growth of semiconductor parallel to the a-axis which is perpendicular to the extending direction of the linear second region R2, can be further improved in crystallinity. Actually, the second regions R2 are formed so that the longitudinal direction of the second region R2 is a direction at an angle of 5° or less from the m-axis of the GaN substrate G10. Even when no second region R2 is formed, in some cases, non-crystal portions X10 may be formed.

7. Summary of Embodiment 1

As described above, a seed crystal provided with first regions R1 and second regions R2 is used as the seed crystal T10 for the flux method in the method for producing a Group III nitride semiconductor crystal according to Embodiment 1. Then, semiconductor crystal is grown on the first regions R1 of the GaN substrate G10. Non-crystal portions X10 are formed on the mask layer 140. Threading dislocations (lattice defects) from the semiconductor layer below the non-crystal portions X10 are not inherited to the GaN layer 150 disposed on the non-crystal portions X10. The thus-formed GaN crystal has satisfactorily low dislocation density. New dislocations hardly occur at the joint interface of growing crystals, and stress from the mask layer 140 is not applied to the GaN layer 150, by virtue of non-crystal portions X10. Thus, a Group III nitride semiconductor crystal of excellent crystallinity and having little residual stress or few cracks can be formed.

Notably, Embodiment 1 is given for the purpose of illustration only, and needless to say, those skilled in the art can conceive various modifications and variations, so long as the scope of the invention is not impaired. The number of first regions R1 and second regions R2 provided in the seed crystal T10 is actually a larger number, as compared with the number of first regions R1 and second regions R2 illustrated in the drawings. However, the fact remains that the first regions R1 and the second regions R2 are formed in a regular manner.

Embodiment 2

Embodiment 2 will be described. In Embodiment 2, the same procedure as that of Embodiment 1 is repeated, except that the seed crystal T10 is a GaN layer epitaxially grown on a sapphire substrate. Thus, the same description in relation to Embodiment 1 will be omitted.

1. Group III Nitride Semiconductor Crystal
1-1. GaN Crystal

Figure 7:
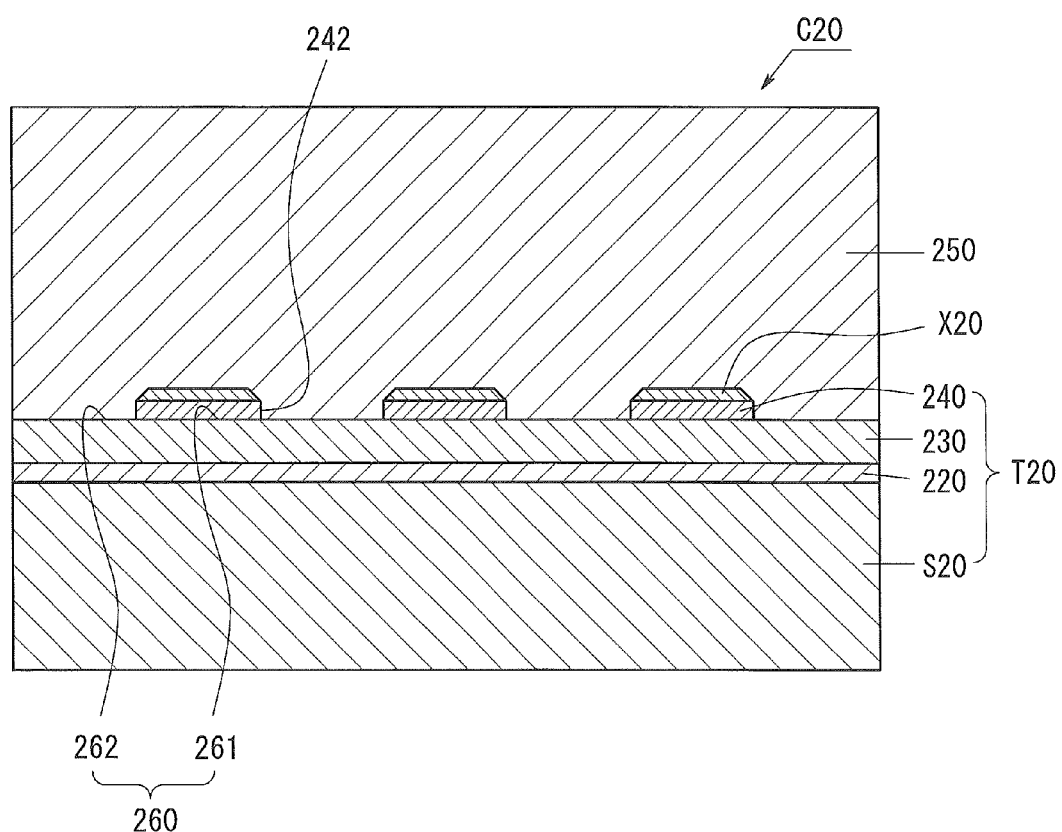
FIG. 7 is a sketch (part 1) for describing a method for producing a Group III nitride semiconductor crystal according to Embodiment 2.

FIG. 7 shows the cross-sectional structure of GaN crystal C20 produced through the method for producing a Group III nitride semiconductor crystal according to Embodiment 2. The GaN crystal C20 has a seed crystal T20 and a GaN layer 250. Non-crystal portions X20 are formed between the seed crystal T20 and the GaN layer 250.

The seed crystal T20 has a sapphire substrate S20, a low-temperature buffer layer 220, a GaN layer 230, and a patterned mask layer 240. On portions 261 of the top surface 260 of the GaN layer 230, the mask layer 240 is formed, and on the remaining portion, i.e., exposed portion 262 of the top surface 260 of the GaN layer 230, the mask layer is not formed. The GaN layer 250 is in contact with the remaining portion 262 of the top surface 260 and non-crystal portions X20. The GaN layer 250 is also in contact with the side surfaces 242 of the mask layer 240.

Figure 8:
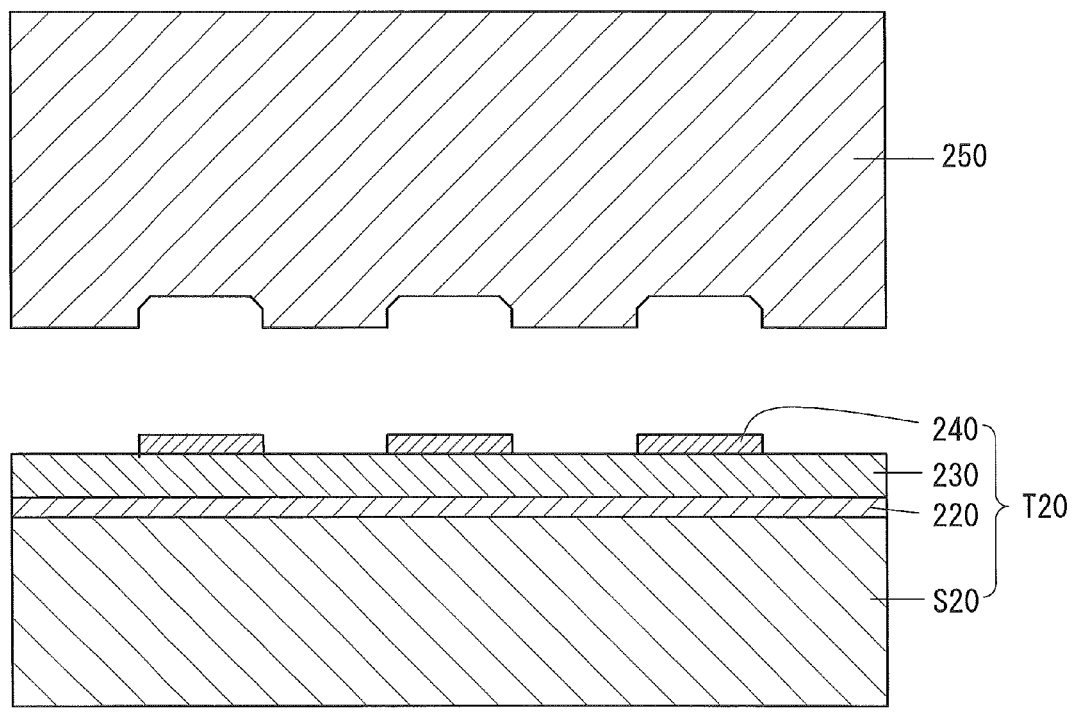
FIG. 8 is a sketch (part 2) for describing the method for producing a Group III nitride semiconductor crystal according to Embodiment 2.

Regarding the GaN crystal C20 of Embodiment 2, as shown in FIG. 8, the GaN layer 250 can be readily separated from the seed crystal T20. This is because non-crystal portions X20 are liquid at the growth temperature of semiconductor crystal, and they are not connected with the GaN layer 250 or the mask layer 240.

2. Seed Crystal

Figure 9:
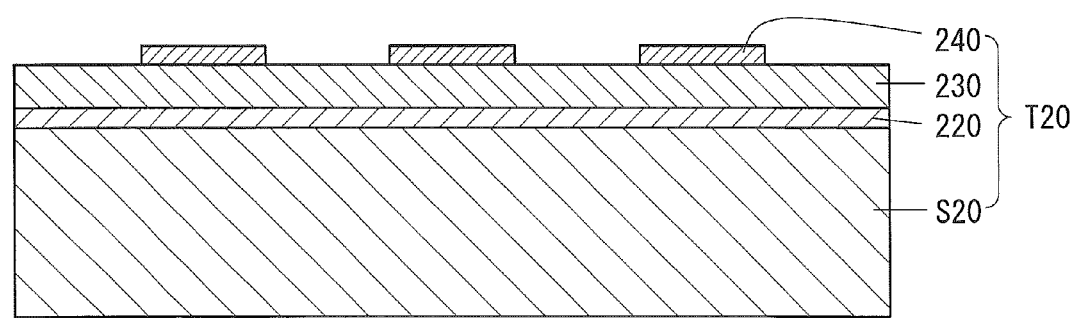
FIG. 9 is a sketch for describing a seed crystal used in the method for producing a Group III nitride semiconductor crystal according to Embodiment 2.

The seed crystal T20 used in the method for producing a Group III nitride semiconductor crystal according to Embodiment 2 will be described. The seed crystal T20 has a sapphire substrate S20, a low-temperature buffer layer 220, a GaN layer 230, and a mask layer 240 as shown in FIG. 9. The sapphire substrate S20 is a sapphire substrate having a c-plane main surface. The low-temperature buffer layer 220 is a layer formed of GaN or AlN. The GaN layer 230 is an underlayer on which a mask layer 240 is to be formed. The mask layer 240 is a layer to inhibit the growth of the GaN layer 250. Others are the same as the seed crystal T10 of Embodiment 1.

3. Method for Producing a Group III Nitride Semiconductor Crystal

The method for producing a Group III nitride semiconductor crystal according to Embodiment 2 includes the following steps:
(C-1) Low-temperature-deposited buffer layer formation step
(C-2) Underlayer formation step
(A) Mask layer formation step
(B) Semiconductor crystal formation step
These steps will next be described in detail.

3-1. (C-1) Low-Temperature-Deposited Buffer Layer Formation Step

Firstly, a low-temperature-deposited buffer layer 220 is formed on a sapphire substrate S20 serving as a growth substrate (see FIG. 7). A main surface of the sapphire substrate S20 is a c-plane. The low-temperature-deposited buffer layer 220 is formed on the sapphire substrate S20. Examples of the growth technique include metalorganic chemical vapor deposition (MOCVD), hydride vapor phase epitaxy (HVPE), molecular beam epitaxy (MBE), and liquid phase epitaxy. Any of these techniques may be employed. The low-temperature-deposited buffer layer 220 is a GaN layer. The layer 220 may be an AlN layer.

3-2. (C-2) Underlayer Formation Step

Subsequently, a GaN layer 230 is formed on the low-temperature-deposited buffer layer 220 (see FIG. 7). The GaN layer 230 serves as an underlayer. The GaN layer 230 preferably has a thickness of 1.5 µm to 30 µm. In the underlayer formation step, any of metalorganic chemical vapor deposition (MOCVD), hydride vapor phase epitaxy (HVPE), molecular beam epitaxy (MBE), and liquid phase epitaxy may be employed.

3-3. (A) Mask Layer Formation Step

Then, a mask layer 240 is formed on the GaN layer 230 (see FIG. 7). The mask layer 240 has the same pattern as that of the mask layer 140 shown in FIG. 3.

3-3. (B) Semiconductor Crystal Formation Step

Subsequently, a semiconductor crystal layer is formed on the seed crystal T20 through a flux method, which is a technique of liquid phase epitaxy. The same raw materials as shown in Table 1 may be used. The same conditions of the flux method as shown in Table 2 may be employed.

After the raw material concentrations of flux reached super-saturation through temperature and pressure increase, a GaN layer 250 is grown from the first regions as a growth starting points. While non-crystal portions X20 are formed, the GaN layer 250 is formed. Thus, a GaN crystal C20 shown in FIG. 7 is produced.

4. Produced Group III Nitride Semiconductor Crystal

The GaN crystal C20 has the GaN layer 250. The properties of the GaN layer 250 are almost the same as those of the GaN layer 150 described in Embodiment 1. The GaN layer 250 has a dislocation density of $1 \times 10^5/cm^2$ or less. The dislocation density is uniform over the GaN layer 250, since a plurality of non-crystal portions X23 are arranged in a regular manner. Regarding separability between the seed crystal T20 and the GaN layer 250, the GaN layer 250 can be more easily separated from the seed crystal T20 than the GaN layer 150 of Embodiment 1 since the stress from the sapphire substrate S20 is applied to the interface between the seed crystal T20 and the GaN layer 250.

5. Variation
5-1. Sapphire Substrate

In Embodiment 2, a c-plane sapphire substrate S20 is used. Other sapphire substrate such as a-plane sapphire substrate may be used. The main surface of the GaN layer 230 is a c-plane because GaN having a c-plane as a main surface grows on the a-plane of sapphire. Therefore, a relationship of crystal orientation between the GaN layer 230 and the linear second region R2 is the same as in Embodiment 1.

5-2. Other Variations

In Embodiment 2, all the variations described in Embodiment 1 may be applied.

6. Summary of Embodiment 2

As described above, a seed crystal provided with first regions and second regions is used as the seed crystal T20 for the flux method in the method for producing a Group III nitride semiconductor crystal according to Embodiment 2. Non-crystal portions X20 are formed on the mask layer 240.

Dislocations (lattice defects) from the semiconductor layer below the non-crystal portions X20 are not inherited to the GaN layer 250 above the non-crystal portions X20. The thus-formed GaN crystal has satisfactorily low dislocation density. New dislocations hardly occur at the joint interface of growing crystals, by virtue of non-crystal portions X20. Thus, a Group III nitride semiconductor crystal of excellent crystallinity can be formed. Stress from the mask layer 240 is not applied to the GaN layer 250 by virtue of non-crystal portions X20. Therefore, a GaN crystal having little residual stress or few cracks is produced.

Embodiment 3

Figure 10A:
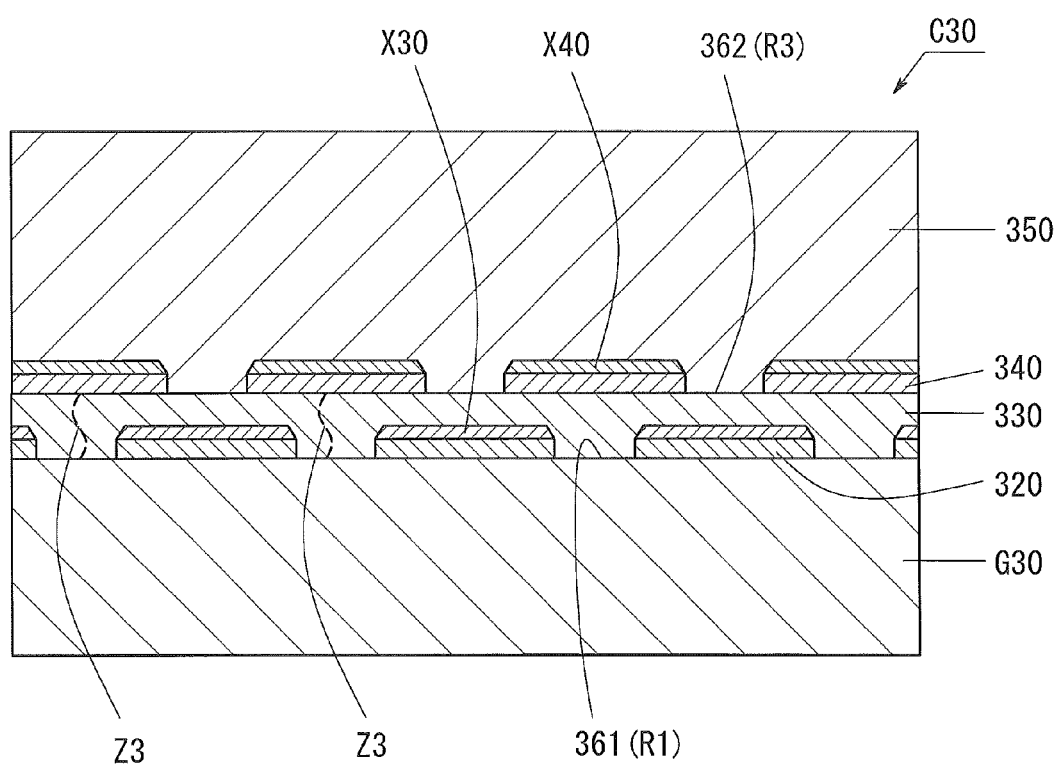
FIG. 10A is a B-B cross section view of FIG. 10B which is a plan view for describing a Group III nitride semiconductor crystal according to Embodiment 3.
Figure 10B:
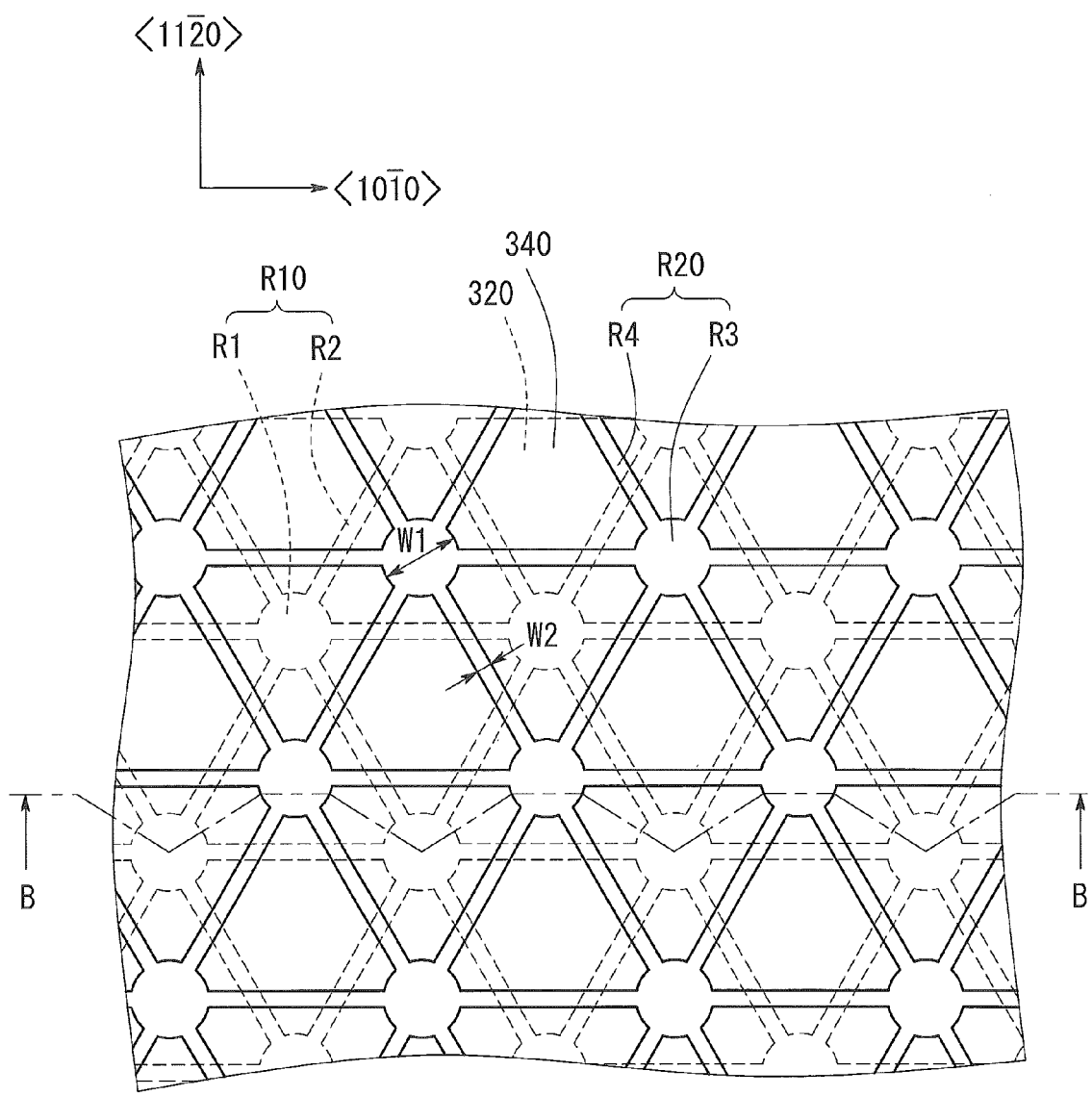
FIG. 10B is a sketch for describing a seed crystal used in the method for producing a Group III nitride semiconductor crystal according to Embodiment 3.

Embodiment 3 will be described. In Embodiment 3, a GaN crystal C30 having two-stage, i.e., the first stage and the second stage, mask layer is produced as shown in FIGS. 10A and 10B. FIG. 10A is a cross section cut along the B-B line of the triangle pattern in the plan view of FIG. 10B.

1. Group III Nitride Semiconductor Crystal

The GaN crystal C30 has a GaN substrate G30, a first mask layer 320, a first GaN layer 330, a second mask layer 340, and a second GaN layer 350. First non-crystal portions X30 are formed between the first mask layer 320 and the first GaN layer 330. Second non-crystal portions X40 are formed between the second mask layer 340 and the second GaN layer 350. As shown in FIGS. 10A and 10B, the second mask layer 340 is formed on an extension line perpendicular to the main surface of the GaN substrate G30 as viewed from the first exposed portion 361 (the first region R1 of the first stage) as a growth starting point of the first GaN layer 330. Moreover, a second exposed portion 362 (the first region R3 of the second stage) is formed on the first mask layer 320. Therefore, dislocations Z3 of the first GaN layer 330 growing on the GaN substrate G30 is obstructed by the second mask layer 340. On the other hand, there are few dislocations above the first mask layer 320. Accordingly, the second GaN layer 350 vertically and laterally grown from the second exposed portion 362 (R3) has excellent crystallinity. The obtained GaN crystal C30 has a lower dislocation density than those of Embodiments 1 and 2. Dislocations at the joint interface of growing crystals can be suppressed as in Embodiments 1 and 2. In addition, in Embodiment 3, a GaN crystal having few dislocations is produced because a plurality of mask layers is formed. An exposed portion R20 of the second stage has the first region R3 and the second region R4 as same as the first stage. A structure of a second region R4 of the second stage is as same as that of the second region R2 of the first stage.

2. Production Method

In Embodiment 3, the following steps are performed: (A) first mask layer formation step of forming a first mask layer on an underlayer, (B) first semiconductor crystal formation step of forming a first Group III nitride semiconductor crystal on the first mask layer in a molten mixture, (C) second mask layer formation step of forming a second mask layer on the first Group III nitride semiconductor crystal, and (D) second semiconductor crystal formation step of forming a second Group III nitride semiconductor crystal on the second mask layer in the molten mixture. In the second mask layer formation step, a second mask layer 340 is formed at a position perpendicular to the main surface of the first mask layer 320 as viewed from the first exposed portion 361 (R1) of the first mask layer 320. The central axis of the first mask layer 320 coincides with the central axis of the second exposed portion 362 (R3). The central axis of the first exposed portion 361 (R1) coincides with the central axis of the second mask layer 340. Needless to say, the second mask layer may be formed at a position shifted from this position.

The second mask layer formation step is preferably performed after the first GaN layer 330 is polished and flattened.

2. Variation

Two-stage mask layer of Embodiment 3 may be formed on the GaN layer 230 on the sapphire substrate S20 used in Embodiment 2. This variation may be combined with the variations described in Embodiments 1 and 2.

Embodiment 4

Embodiment 4 will be described. In Embodiment 4, a method for producing a GaN substrate using the method for producing a Group III nitride semiconductor crystal described in Embodiments 1 to 3.

1. Method for Producing Group III Nitride Semiconductor Crystal

The method for producing a Group III nitride semiconductor crystal according to Embodiment 4 includes the following step after the steps described in Embodiments 1 to 3:

(D) Semiconductor Crystal Separation Step 1-1. (D) Semiconductor Crystal Separation Step As described above, in the GaN crystal C10, C20, and C30 having non-crystal portions X10, X20, X30, and X40 and the GaN layers 150, 250, 330, and 350 are easily separated from the growth substrate. This is because non-crystal portions X10, X20, X30, and X40 are liquid at the growth temperature of semiconductor crystal, and they are not connected with the GaN layers 150, 250, 330, and 350, respectively. As shown in FIGS. 2 and 8, the GaN crystal is separated from the growth substrate through heating and cooling by using a difference between the thermal expansion coefficients of the GaN crystal and the growth substrate. Through this separation, the non-crystal portions X10, X20, X30, and X40 are spontaneously removed.

Actually, a portion of the mask layers 140, 240, 320 and 340 or the non-crystal portions X10, X20, X30, and X40 could remain adhered to the GaN crystal. In this case, problem is solved by shaving the surface. Thus, a GaN self-standing substrate is produced.

2. Summary of Embodiment 4

As described above, in the method for producing a GaN substrate according to Embodiment 4, a GaN self-standing substrate is produced by removing the GaN crystal formed using the method described in Embodiments 1 to 3 from the growth substrate.

1. Example 1

1-1. Mask Layer Formation

Example 1 will be described. In Example 1, the method for producing a Group III nitride semiconductor crystal according to Embodiment 1 was used. A c-plane GaN self-standing substrate was employed. The GaN self-standing substrate had a diameter of 2 inches (50.8 mm). An $Al_2O_3$ layer was formed on the GaN self-standing substrate through ALD so as to have a thickness of 100 nm.

Subsequently, depositing resist on the $Al_2O_3$ layer and patterning of the resist was performed to make a resist mask. The $Al_2O_3$ layer was etched by immersing in Buffered Hydrogen Fluoride (BHF) until the underlayer (GaN) is exposed. After the resist mask was removed to make a patterned mask layer, cleaning of the substrate was performed. Here, the mask layer has a pattern of shapes close to a regular triangle, each side of which has a length of 300 μm, the first region R1 has an inside width W1 of 90 μm, and an angle between the extending direction of the second region R2 and the m-axis of GaN is 5° or less.

1-2. Growth

Subsequently, the seed crystal was placed in the semiconductor crystal production apparatus. The raw materials of Ga (30 g), Na (30 g), and C (80 mg) were placed in the crucible in the semiconductor crystal production apparatus. The temperature and pressure were elevated while supplying nitrogen gas. The temperature inside the apparatus was 870° C. The pressure inside the apparatus was 4 MPa. During crystal growth, the direction of rotation of the turn-table was appropriately altered, and the mixture was stirred at 20 rpm by means of a rotating member. The GaN growth time was 60 hours.

1-3. Produced GaN Crystal

As a result, a GaN crystal was yielded. Portions corresponding to non-crystal portions X10 were formed. The thus-grown GaN layer could be easily separated from the seed crystal. During separation, it was found that the flux component flowed out. The thus-grown GaN layer had a thickness of 0.9 mm. The thus-obtained crystal had a uniform dislocation density of $1 \times 10^5/\text{cm}^2$ or less.

Figure 11:
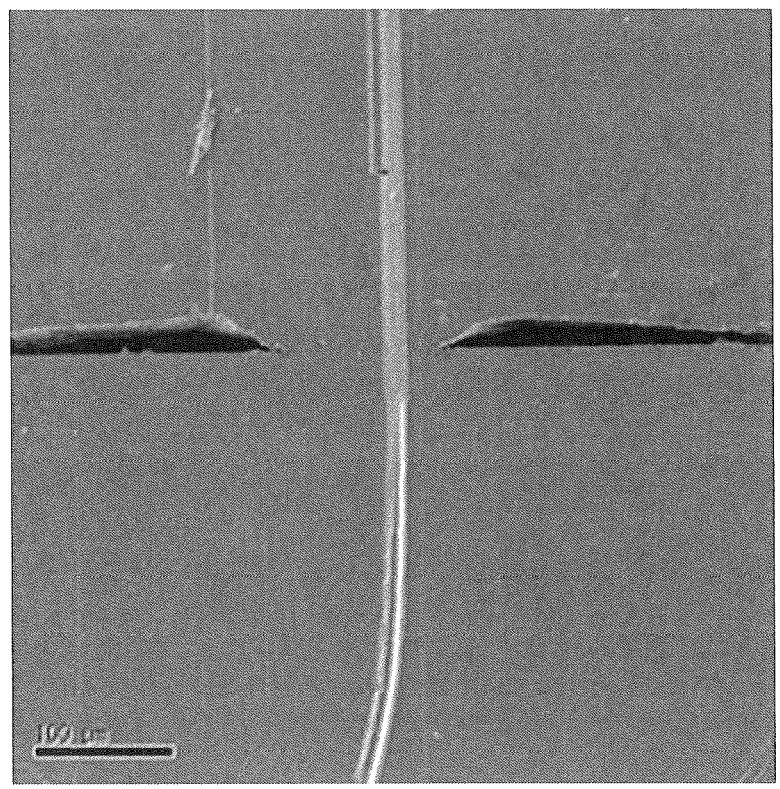
FIG. 11 is a SEM image showing a cross section of non-crystal portion of GaN crystal produced in Example.

FIG. 11 is a SEM image showing a cross section of the thus-obtained GaN crystal. As shown in FIG. 11, traces of the non-crystal portions were observed. Before observation, the flux component of the non-crystal portions was cleaned off, and the GaN crystal free from flux was observed. In the SEM image of FIG. 11, a line in a vertical direction is not a dislocation but a crack inevitably formed when cutting for observation of a cross section.

Figure 12:
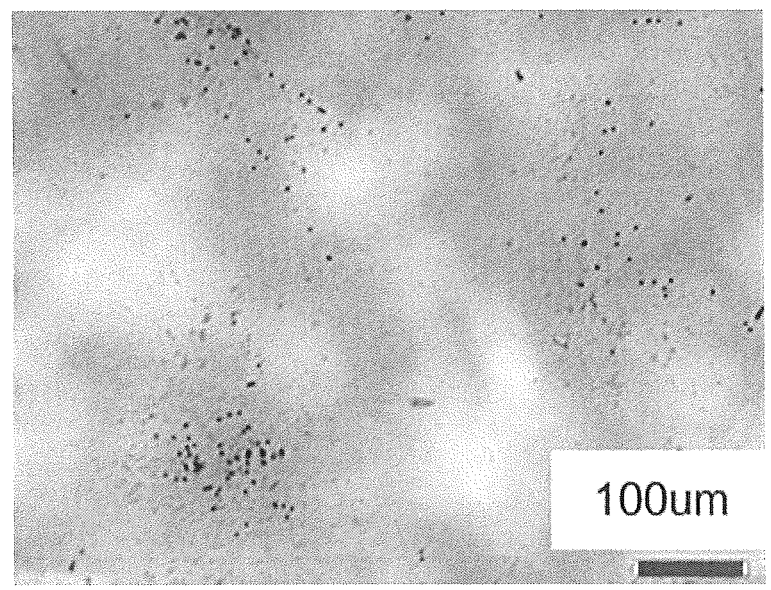
FIG. 12 is a SEM image showing pits of GaN crystal produced in Example.

After the surface was polished and flattened by Chemical Mechanical Polishing (CMP), the GaN surface was etched by KOH, and pits were observed. FIG. 12 shows the SEM images of the pits. The pits were formed in a position above the first region R1, but hardly formed in the second region R2. From this result, the semiconductor crystal was grown with the first region R1 as a growth starting point.

What is claimed is:

1. A method for producing a Group III nitride semiconductor crystal, the method comprising:
    forming a mask layer on an underlayer, to thereby form an exposed portion of the underlayer which is not covered with the mask layer, and an unexposed portion of the underlayer which is covered with the mask layer, wherein as the exposed portion, a plurality of growth starting regions discretely are disposed, connecting portions each having a linear pattern and each of which connects a nearest two of the plurality of growth starting regions are formed, each area of the growth starting regions is larger than each area of the connecting portions, and a width of each area of the growth starting regions is larger than a width of each of the connecting portions;
    growing a Group III nitride semiconductor crystal in a molten mixture containing at least Group III metal and Na; and
    wherein, the growing of the Group III nitride semiconductor crystal comprises growing the Group III nitride semiconductor crystal in a vertical direction from surfaces of the growth starting regions, in lateral direction over the mask and in lateral direction over surfaces of the connecting portions for promoting a lateral growth over the mask and guiding the lateral growth along the connecting portions.

2. The method for producing a Group III nitride semiconductor crystal according to claim 1, wherein the growth starting regions are disposed at vertices of a triangle, and the connecting portions are disposed at positions corresponding to sides of the triangle.

3. The method for producing a Group III nitride semiconductor crystal according to claim 2, wherein the connecting portions are formed with a longitudinal direction thereof oriented at an angle of 5° or less from an m-axis of the underlayer.

4. The method for producing a Group III nitride semiconductor crystal according to claim 1, the method further comprising:
    forming a first mask layer on the underlayer;
    growing a first Group III nitride semiconductor crystal on the first mask layer in the molten mixture;
    forming a second mask layer on the first Group III nitride semiconductor crystal; and
    growing a second Group III nitride semiconductor crystal on the second mask layer in the molten mixture.

5. The method for producing a Group III nitride semiconductor crystal according to claim 2, the method further comprising:
    forming a first mask layer on the underlayer;
    growing a first Group III nitride semiconductor crystal on the first mask layer in the molten mixture;
    forming a second mask layer on the first Group III nitride semiconductor crystal; and
    growing a second Group III nitride semiconductor crystal on the second mask layer in the molten mixture.

6. The method for producing a Group III nitride semiconductor crystal according to claim 3, the method further comprising:
    forming a first mask layer on the underlayer;
    growing a first Group III nitride semiconductor crystal on the first mask layer in the molten mixture;
    forming a second mask layer on the first Group III nitride semiconductor crystal; and
    growing a second Group III nitride semiconductor crystal on the second mask layer in the molten mixture.

7. The method for producing a Group III nitride semiconductor crystal according to claim 4, wherein the second mask layer is formed at a position perpendicular to a main surface of the mask layer as viewed from the exposed portion of the first mask layer.

8. The method for producing a Group III nitride semiconductor crystal according to claim 5, wherein the second mask layer is formed at a position perpendicular to a main surface of the mask layer as viewed from the exposed portion of the first mask layer.

9. The method for producing a Group III nitride semiconductor crystal according to claim 1, wherein the mask layer is formed through atomic layer deposition.

10. The method for producing a Group III nitride semiconductor crystal according to claim 1, wherein the mask layer comprises $Al_2O_3$.

11. The method for producing a Group III nitride semiconductor crystal according to claim 1, wherein the mask layer comprises at least one of $ZrO_2$ and $TiO_2$.

12. A method for producing a Group III nitride semiconductor substrate, the method comprising:
    forming a mask layer on an underlayer, and forming a seed crystal having an exposed portion of the underlayer which is not covered with the mask layer and an unexposed portion of the underlayer which is covered with the mask layer, wherein as the exposed portion, a plurality of growth starting regions discretely are disposed, connecting portions each having a linear pattern and each of which connects a nearest two of the plurality of growth starting regions are formed, each area of the growth starting regions is larger than each area of the connecting portions, and a width of each area of the growth starting regions is larger than a width of each of the connecting portions;

growing a Group III nitride semiconductor crystal in a molten mixture containing at least Ga and Na;

separating the Group III nitride semiconductor crystal from the seed crystal; and wherein, the growing of the Group III nitride semiconductor crystal comprises growing the Group III nitride semiconductor crystal in a vertical direction from surfaces of the growth starting regions, in lateral direction over the mask and in lateral direction over surfaces of the connecting portions for promoting a lateral growth over the mask and guiding the lateral growth along the connecting portions.

13. The method for producing a Group III nitride semiconductor substrate according to claim 12, wherein the growth starting regions are disposed at vertices of a triangle, and the connecting portions are disposed at positions corresponding to sides of the triangle.

14. The method for producing a Group III nitride semiconductor substrate according to claim 13, wherein the connecting portions are formed with a longitudinal direction thereof oriented at an angle of 5° or less from an m-axis of the underlayer.

15. The method for producing a Group III nitride semiconductor crystal according to claim 1, wherein, in the growing of the Group III nitride semiconductor crystal, non-crystal portions containing the components of the molten mixture are formed on the mask layer.

16. The method for producing a Group III nitride semiconductor substrate according to claim 12, wherein, in the growing of the Group III nitride semiconductor crystal, non-crystal portions containing the components of the molten mixture are formed on the mask layer.

17. The method for producing a Group III nitride semiconductor substrate according to claim 16, wherein, in the separating of the Group III nitride semiconductor crystal, when separating the Group III nitride semiconductor crystal from the seed crystal, the components of the molten mixture are removed out from the non-crystal portions.

* * * * *